(12) United States Patent
Chang et al.

(10) Patent No.: US 7,839,715 B2
(45) Date of Patent: Nov. 23, 2010

(54) SERDES DOUBLE RATE BITLINE WITH INTERLOCK TO BLOCK PRECHARGE CAPTURE

(75) Inventors: Leland Chang, New York, NY (US); Gary Ditlow, New York, NY (US); Robert K. Montoye, Rochester, MN (US); Salvatore N. Storino, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 198 days.

(21) Appl. No.: 12/260,376

(22) Filed: Oct. 29, 2008

(65) Prior Publication Data

US 2010/0106996 A1    Apr. 29, 2010

(51) Int. Cl.
*G11C 8/00*    (2006.01)
(52) U.S. Cl. ............... 365/233.1; 365/203; 365/189.05
(58) Field of Classification Search .............. 365/233.1, 365/203, 189.05
See application file for complete search history.

(56) References Cited

U.S. PATENT DOCUMENTS

| 5,909,394 | A | 6/1999 | Chou |
| 6,850,460 | B1 * | 2/2005 | Chan et al. ............... 365/233.1 |
| 6,891,774 | B1 * | 5/2005 | Abdollahi-Alibeik et al. ...................... 365/233.1 |
| 7,158,412 | B2 | 1/2007 | Rodgers, III |

* cited by examiner

*Primary Examiner*—Huan Hoang
(74) *Attorney, Agent, or Firm*—Cahn & Samuels LLP

(57) ABSTRACT

An embodiment of the invention provides a method of separating an early clock pulse and a late clock pulse into two different latches, wherein the early clock pulse is generated through a bit line. In response to the early clock pulse rising, a first data waveform is sent to a fourth data waveform. In response to a third data waveform rising, an early precharge is turned off. In response to the turning off of the early precharge and in response to a fifth data waveform dropping, an eighth data waveform rises if the first data waveform has a value of 1. In response to a sixth data waveform rising, a first pulse latch is opened.

1 Claim, 3 Drawing Sheets

... ...

SERDES DOUBLE RATE BITLINE WITH INTERLOCK TO BLOCK PRECHARGE CAPTURE

I. FIELD OF THE INVENTION

The present invention is in the field of method, computer program products, and devices for a serialization/deserialization (SerDes) double rate bitline with interlock to block precharge capture.

II. BACKGROUND OF THE INVENTION

Random access memories (RAMs), static dynamic memories (SRAMs), and dynamic random access memories (DRAMs) are typically arranged in a square array of one capacitor and transistor per cell. Long lines connecting each row are known as word lines. Each column includes two bitlines, each one connected to every other storage cell in the column. They are generally known as the + and − bitlines. A sense amplifier is essentially a pair of cross-connected inverters between the bitlines. That is, the first inverter is connected from the + bitline to the − bitline, and the second is connected from the − bitline to the + bitline. This is an example of positive feedback, and the arrangement is only stable with one bitline high and one bitline low.

Serialization is the process of saving an object onto a memory cell or transmitting it across a network connection link in binary form. When the resulting series of bytes is reread according to the serialization format, it can be used to create an accurate clone of the original object. This process of serializing an object is also called deflating or marshalling an object. The opposite operation, extracting a data structure from a series of bytes, is deserialization (which is also called inflating or unmarshalling).

III. SUMMARY OF THE INVENTION

An embodiment of the invention provides a method of separating an early clock pulse and a late clock pulse into two different latches, wherein the early clock pulse is generated through a bit line. In response to the early clock pulse rising, a first data waveform is sent to a fourth data waveform. In response to a third data waveform rising, an early precharge is turned off. In response to the turning off of the early precharge and in response to a fifth data waveform dropping, an eighth data waveform rises if the first data waveform equals a value of 1. In response to a sixth data waveform rising, a first pulse latch is opened.

A falling period of the early data pulse begins. In response to the sixth data waveform falling, the first pulse latch is closed. After closing the first pulse latch and in response to the third data waveform falling, the early precharge is turned on. In response to the turning on of the early precharge, the fifth data waveform rises.

The late clock pulse is generated through the bit line. In response to the late clock pulse rising, a second data waveform is sent to the fourth data waveform. In response to the third data waveform rising, a late precharge is turned off. In response to the turning off of the late precharge and in response to the fifth data waveform dropping, a ninth data waveform rises if the second data waveform equals a value of 1. In response a seventh data waveform rising, a second pulse latch is opened.

A falling period of the late clock pulse begins. In response to the seventh data waveform falling, the second pulse latch is closed. After the second pulse latch closes and in response to the third data waveform falling, the late precharge is turned on. In response to the turning on of the late precharge, the fifth data waveform rises. The method prevents capture of the early clock pulse into the second pulse latch and capture of the late clock pulse into the first pulse latch. Moreover, the method prevents capture of the early precharge and the late precharge into the first pulse latch and the second pulse latch.

IV. BRIEF DESCRIPTION OF THE DRAWINGS

The present invention is described with reference to the accompanying drawings. In the drawings, like reference numbers indicate identical or functionally similar elements.

V. DETAILED DESCRIPTION OF THE DRAWINGS

Exemplary, non-limiting, embodiments of the present invention are discussed in detail below. While specific configurations are discussed to provide a clear understanding, it should be understood that the disclosed configurations are provided for illustration purposes only. A person of ordinary skill in the art will recognize that other configurations may be used without departing from the spirit and scope of the invention.

At least one embodiment of the invention provides a method of deserializing two data pulses (also referred to herein as "clock pulses") on a Global Bit Line (GBL) per clock cycle. When the GBL (also referred to herein as "bitline") dynamic OR gate has two serial data pulses, early and late data are separated into independent latches without race.

The dynamic circuit cycles two times per cycle. Thus, the dynamic circuit operates in the following sequence per clock: Evaluation1, Precharge1, Evaluation2, and Precharge2. Knowing that the serial data is separated into early and late, timing prevents early data from being captured into the late latch and late data from being captured into the early latch. In addition, this timing prevents Precharge1 and Precharge2 from being mistaken as data into the deserialization latches. Thus, an embodiment of the invention provides an interlock path that prevents this mishap. This is done by ensuring that path (data waveforms 1 and 2) to (data waveform 3) matches path (data waveforms 1 and 2) to (data waveforms 6 and 7), thereby forming an interlock to ensure evaluation and precharge are always sequential and in order. Moreover, an embodiment of the invention provides for the embedding of a muxed dynamic circuit with clocking interlocks into a pulse latch.

Figure 1:
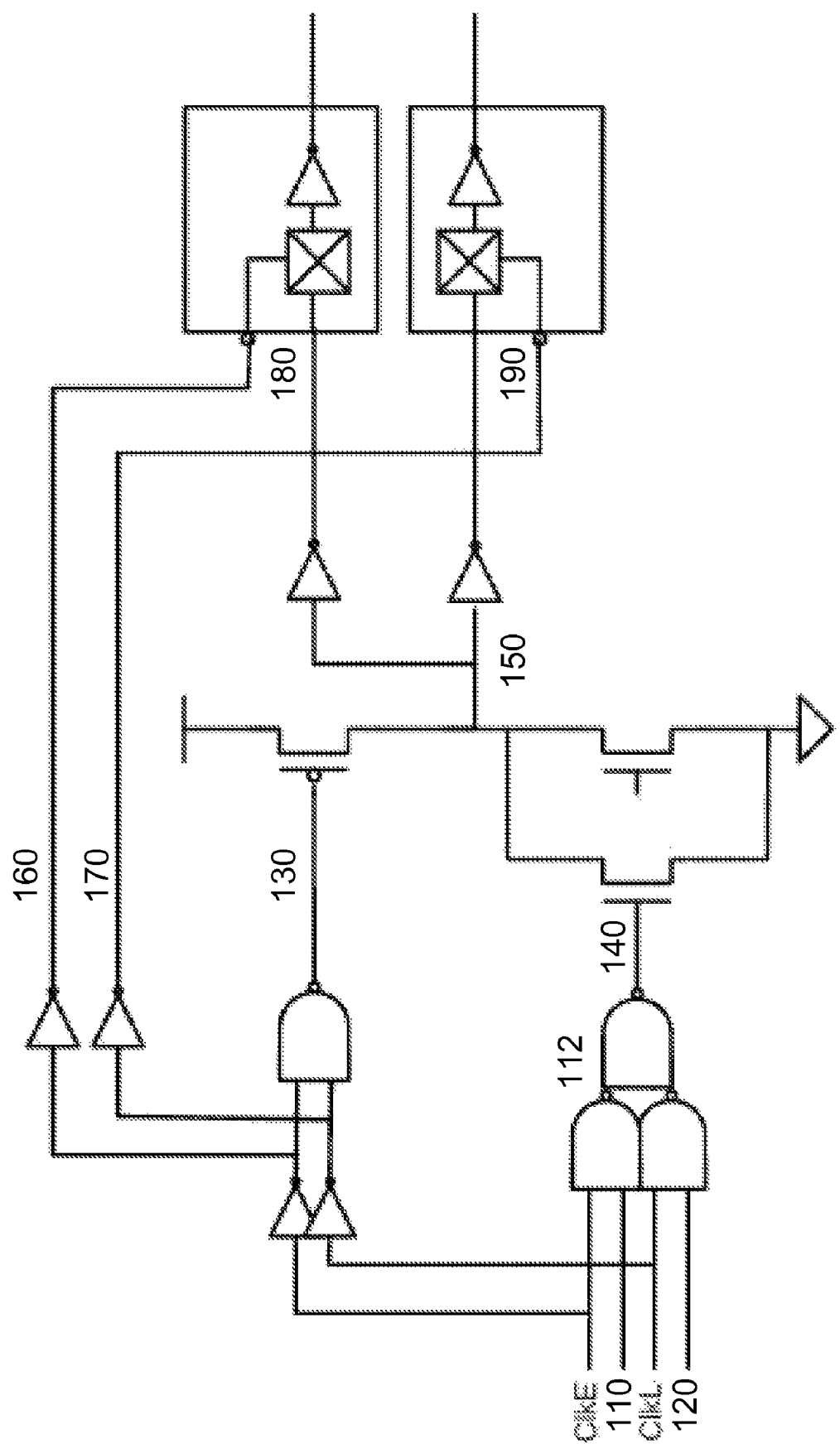
FIG. 1 is a diagram illustrating a SerDes regfile dynamic bitline with no race according to one embodiment of the invention.
Figure 2:
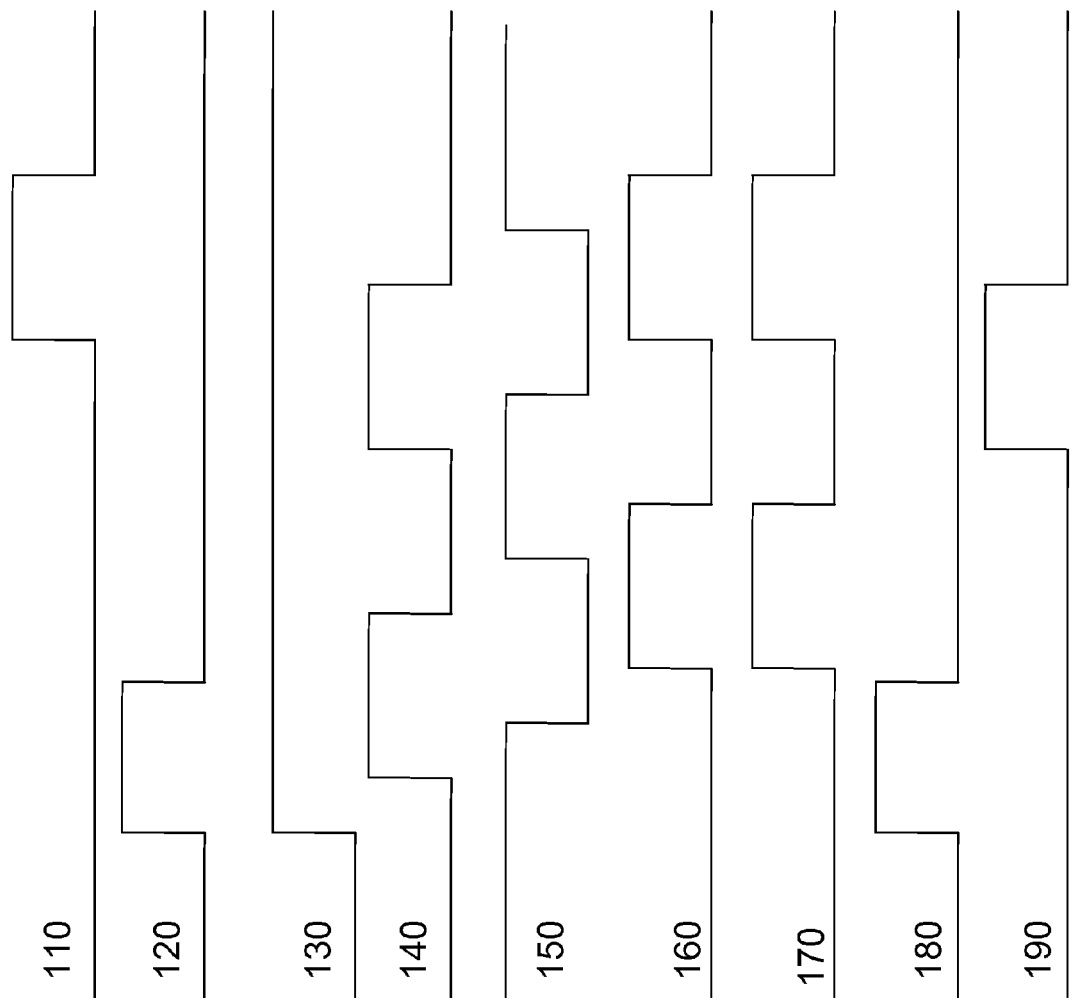
FIG. 2 illustrates waveforms according to one embodiment of the invention.

FIG. 1 is a diagram illustrating a SerDes regfile dynamic bitline with no race according to one embodiment of the invention. ClkE and CLkL are the early and late clock pulses, respectively. When ClkE rises, Data 1 (also referred to herein as the "first data waveform") 110 is sent through a multiplexer 112 and received at a fourth data waveform 140. FIG. 2 illustrates the waveforms 110-190 according to one embodiment of the invention.

A third data waveform 130 rises, thereby turning off a precharge of the early clock pulse (also referred to herein as the "early precharge"). In response to the turning off of the early precharge, a fifth data waveform 150 drops. This causes a rise in an eighth data waveform 180 if the Data 1 has a value of 1. Moreover, a sixth data waveform 160 rises to open a first pulse latch (also referred to herein as the "early latch"). When ClkE falls, the sixth data waveform 160 also falls, thereby closing the first pulse latch. Following this, the third data waveform 130 falls and the early precharge is turned on. This causes the fifth data waveform 150 to rise.

When the ClkL rises, Data 2 (also referred to herein as the "second data waveform") 120 is sent through the multiplexer 112 and received at the fourth data waveform 140. The third data waveform 130 rises to turn off a precharge of the late clock pulse (also referred to herein as the "late precharge"). In response to the turning off of the late precharge, the fifth data waveform 150 drops. This causes a rise in a ninth data waveform 190 if the Data 2 has a value of 1. Moreover, a seventh data waveform 170 rises to open a second pulse latch (also referred to herein as the "late latch"). When ClkL falls, the seventh data waveform 170 also falls, thereby closing the second pulse latch. Following this, the third data waveform 130 falls and the late precharge is turned on. This causes the fifth data waveform 150 to rise.

Figure 3:
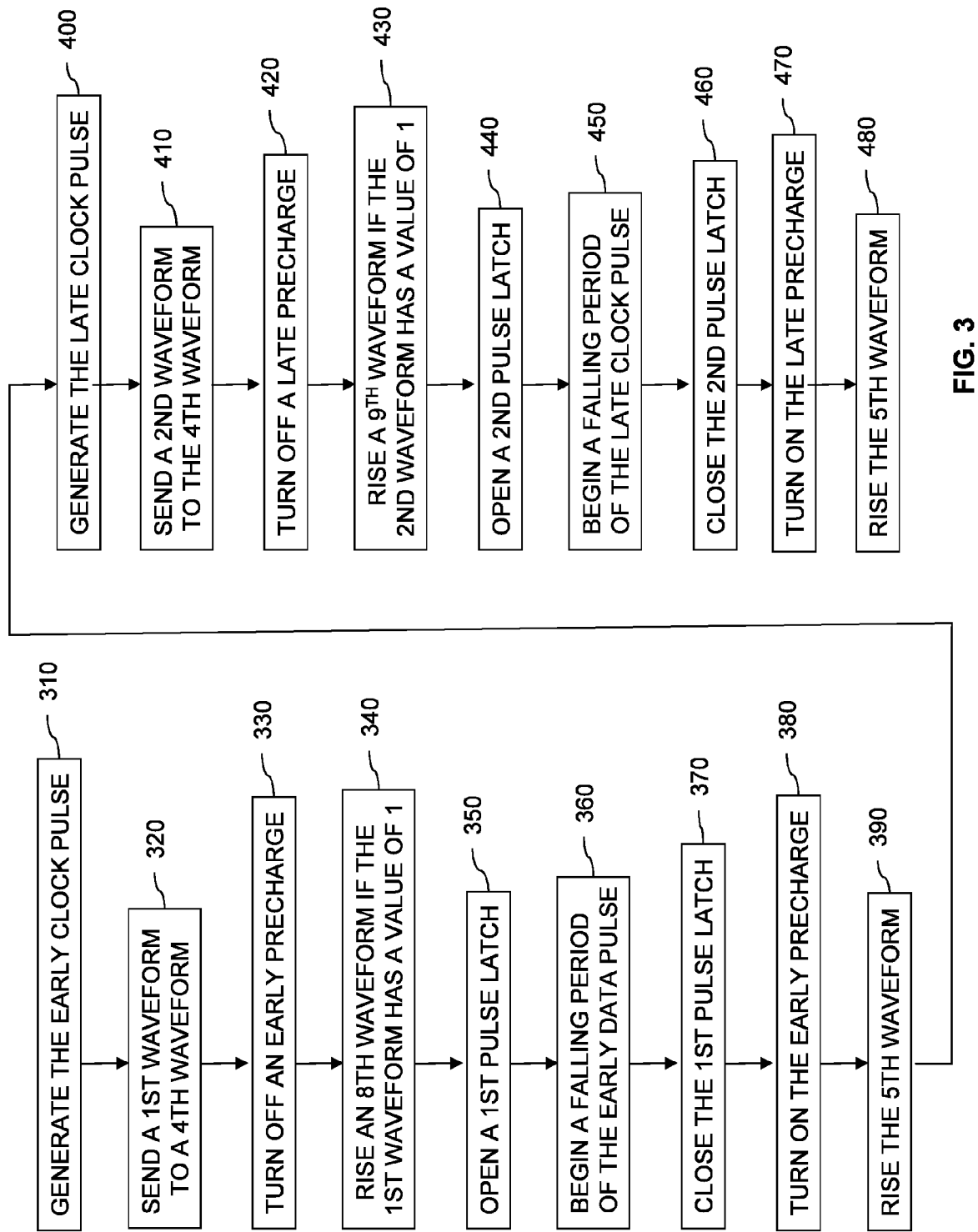
FIG. 3 is a flow diagram illustrating a method of separating an early clock pulse and a late clock pulse into two different latches according to one embodiment of the invention.

FIG. 3 is a flow diagram illustrating a method of separating an early clock pulse and a late clock pulse into two different latches according to one embodiment of the invention. The early clock pulse is generated through a bit line (310). In response to the early clock pulse rising, a first data waveform is sent to a fourth data waveform (320). In response to a third data waveform rising, an early precharge is turned off (330). In response to the turning off of the early precharge and in response to a fifth data waveform dropping, an eighth data waveform rises if the first data waveform has a value of 1 (340). In response to a sixth data waveform rising, a first pulse latch is opened (350).

A falling period of the early data pulse begins (360). In response to the sixth data waveform falling, the first pulse latch is closed (370). After closing the first pulse latch and in response to the third data waveform falling, the early precharge is turned on (380). In response to the turning on of the early precharge, the fifth data waveform rises (390).

The late clock pulse is generated through the bit line (400). In response to the late clock pulse rising, a second data waveform is sent to the fourth data waveform (410). In response to the third data waveform rising, a late precharge is turned off (420). In response to the turning off of the late precharge and in response to the fifth data waveform dropping, a ninth data waveform rises if the second data waveform has a value of 1 (430). In response a seventh data waveform rising, a second pulse latch is opened (440).

A falling period of the late clock pulse begins (450). In response to the seventh data waveform falling, the second pulse latch is closed (460). After the second pulse latch closes and in response to the third data waveform falling, the late precharge is turned on (470). In response to the turning on of the late precharge, the fifth data waveform rises (480). The method prevents capture of the early clock pulse into the second pulse latch and capture of the late clock pulse into the first pulse latch. Moreover, the method prevents capture of the early precharge and the late precharge into the first pulse latch and the second pulse latch.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

We claim:

1. A method of separating an early clock pulse and a late clock pulse into two different latches, comprising:
    generating said early clock pulse through a bit line;
    in response to said early clock pulse rising, sending a first data waveform to a fourth data waveform;
    in response to a third data waveform rising, turning off an early precharge;
    in response to said turning off of said early precharge and in response to a fifth data waveform dropping, rising an eighth data waveform if said first data waveform equals a value of 1;
    in response to a sixth data waveform rising, opening a first pulse latch;
    beginning a falling period of said early data pulse;
    in response to said sixth data waveform falling, closing said first pulse latch;
    after said closing of said first pulse latch and in response to said third data waveform falling, turning on said early precharge;
    in response to said turning on of said early precharge, rising said fifth data waveform;
    generating said late clock pulse through said bit line;
    in response to said late clock pulse rising, sending a second data waveform to said fourth data waveform;
    in response to said third data waveform rising, turning off a late precharge;
    in response to said turning off of said late precharge and in response to said fifth data waveform dropping, rising a ninth data waveform if said second data waveform equals a value of 1;
    in response a seventh data waveform rising, opening a second pulse latch;
    beginning a falling period of said late clock pulse;
    in response to said seventh data waveform falling, closing said second pulse latch;
    after said closing of said second pulse latch and in response to said third data waveform falling, turning on said late precharge; and
    in response to said turning on of said late precharge, rising said fifth data waveform.

* * * * *